(12) United States Patent
Filipovic et al.

(10) Patent No.: US 8,098,103 B2
(45) Date of Patent: Jan. 17, 2012

(54) PLL DISTURBANCE CANCELLATION

(75) Inventors: Daniel F. Filipovic, Solana Beach, CA (US); Gary J. Ballantyne, Christchurch (NZ); Jifeng Geng, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 230 days.

(21) Appl. No.: 12/483,927

(22) Filed: Jun. 12, 2009

(65) Prior Publication Data

US 2010/0315169 A1   Dec. 16, 2010

(51) Int. Cl.
*H03L 7/093* (2006.01)
(52) U.S. Cl. ............................. 331/1 A; 331/17; 327/159
(58) Field of Classification Search .................. 331/16, 331/17, 1 A, 23, 44; 327/156, 159; 375/371, 375/376; 332/123, 126, 127, 128
See application file for complete search history.

(56) References Cited

U.S. PATENT DOCUMENTS

| | | | |
|---|---|---|---|
| 6,646,964 B1 | 11/2003 | Abramovitch et al. | |
| 6,909,331 B2* | 6/2005 | Ballantyne | 331/10 |
| 7,323,944 B2* | 1/2008 | Florescu et al. | 331/14 |
| 2005/0054295 A1 | 3/2005 | Moloudi | |
| 2008/0061850 A1* | 3/2008 | Watanabe | 327/157 |
| 2009/0074124 A1* | 3/2009 | Henzler | 375/371 |

OTHER PUBLICATIONS

Bodson M, et al., "Harmonic Generation in Adaptive Feedforward Cancellation Schemes" IEEE Transactions on Automatic Control, vol. 39, No. 9, Sep. 1994, pp. 1939-1944, XP002601480 ISSN: 0018-9286.
Guo X, et al., "Analysis and Implementation of an Adaptive Algorithm for the Rejection of Multiple Sinusoidal Disturbances" IEEE Transactions on Control Systems Technology, IEEE Service Center, New York, NY, US LNKD-DOI:10.1109/TCST.2008.922566, vol. 17, No. 1, Jan. 1, 2009, pp. 40-50, XP011229362 ISSN: 1063-6536.
International Search Report and Written Opinion—PCT/US2010/038531, International Search Authority—European Patent Office—Oct. 14, 2010.
Bodson, et al.: "Adaptive Algorithms for the Rejection of Sinusoidal Disturbances With Unknown Frequency", Automatica, vol. 33, No. 12, pp. 2213-2221, 1997, Great Britain.

* cited by examiner

*Primary Examiner* — Ryan Johnson
(74) *Attorney, Agent, or Firm* — Jiayu Xu

(57) ABSTRACT

Techniques for cancelling a disturbance signal from a PLL output signal. In an aspect, a cancellation signal is combined with the signal input to a VCO or DCO in the PLL. In a further aspect, the appropriate cancellation signal is derived by analyzing one or more signals within the PLL. The signals within the PLL may be correlated against one or more disturbance signal templates, such as a sinusoid having a known frequency, to derive one or more correlation coefficients. The coefficients may be applied to weight one or more disturbance synthesis functions to generate the cancellation signal. Further aspects provide for joint analysis, synthesis, and cancellation of signals having unknown frequency from the PLL output.

24 Claims, 17 Drawing Sheets

PLL DISTURBANCE CANCELLATION

TECHNICAL FIELD

The disclosure relates to the design of phase-locked loops (PLL's), and more specifically, to a configurable architecture for cancelling disturbance signals within the PLL.

BACKGROUND

In modern communications circuitry, phase-locked loops (PLL's) are used to generate output signals having arbitrary frequency by phase locking to a reference signal having a known frequency. PLL's may be implemented using analog components, a mix of analog and digital components, or they may be all-digital (e.g., ADPLL's).

The performance of PLL's can often degrade due to the coupling of spurs or other repetitive signals into the PLL. Such spurs may arise from, e.g., external sources such as power supply or RF noise, and/or internal sources such as spurs arising from integer and fractional type quantization in an ADPLL. In multi-mode phones and/or other highly integrated chip solutions, multiple systems running concurrently may exacerbate the effects of spurs on a PLL.

It would be desirable to provide techniques to improve PLL spurious performance in a wide variety of scenarios.

SUMMARY

An aspect of the present disclosure provides an apparatus for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising: a disturbance synthesis block and a subtraction element, the disturbance synthesis block configured to generate a synthesized disturbance signal, the subtraction element configured to subtract the synthesized disturbance signal from the output of the loop filter prior to being coupled to the oscillator.

Another aspect of the present disclosure provides an apparatus for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising: a disturbance synthesis block and a subtraction element, the disturbance synthesis block configured to generate a synthesized disturbance signal, the subtraction element configured to subtract the synthesized disturbance signal from the output of the loop filter prior to being coupled to the oscillator; and a disturbance analysis block configured to correlate a signal generated by the PLL with at least one analysis function to generate at least one analysis coefficient, the disturbance synthesis block configured to weight at least one synthesis function with the at least one analysis coefficient to generate the synthesized disturbance signal.

Yet another aspect of the present disclosure provides an apparatus for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising: a spectral synthesis block and a subtraction element, the spectral synthesis block generating a synthesized disturbance signal, the subtraction element configured to subtract the synthesized disturbance signal from the output of the loop filter prior to being coupled to the oscillator; a pre-filter configured to filter the output of the comparator; and a spectral analysis block configured to correlate the output of the pre-filter with at least one analysis complex sinusoid to generate at least one analysis complex coefficient, the spectral synthesis block configured to weight at least one synthesis complex sinusoid with the at least one analysis complex coefficient to generate the synthesized disturbance signal.

Yet another aspect of the present disclosure provides an apparatus for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising: a disturbance subtraction element; and a joint disturbance analysis and synthesis block configured to generate a cancellation signal based on the output of the comparator, the subtraction element configured to subtract the cancellation signal from the output of the loop filter prior to being coupled to the oscillator.

Yet another aspect of the present disclosure provides a method for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the method comprising: synthesizing a synthesized disturbance signal; and subtracting the synthesized disturbance signal from the output of the loop filter prior to the output of the loop filter being coupled to the oscillator.

Yet another aspect of the present disclosure provides a method for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the method comprising: synthesizing a synthesized disturbance signal; subtracting the synthesized disturbance signal from the output of the loop filter prior to the output of the loop filter being coupled to the oscillator; correlating a signal generated by the PLL with at least one analysis function to generate at least one analysis coefficient, the synthesizing a synthesized disturbance signal comprising weighting at least one synthesis function with the at least one analysis coefficient.

Yet another aspect of the present disclosure provides a method for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the method comprising: synthesizing a synthesized disturbance signal; subtracting the synthesized disturbance signal from the output of the loop filter prior to the output of the loop filter being coupled to the oscillator; pre-filtering the output of the comparator; and correlating the output of the pre-filter with at least one analysis complex sinusoid to generate at least one analysis complex coefficient, the synthesizing the synthesized disturbance signal comprising weighting at least one synthesis complex sinusoid with the at least one analysis complex coefficient.

Yet another aspect of the present disclosure provides an apparatus for reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising: means for generating a synthesized disturbance signal; means for subtracting the synthesized disturbance signal from the output of the loop filter prior to being coupled to the oscillator; and means for analyzing a signal generated by the PLL to aid the means for generating the synthesized disturbance signal.

Yet another aspect of the present disclosure provides a computer program product comprising a computer-readable storage medium storing code for causing a computer to reduce a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the code comprising: code for causing a computer to synthesize a synthesized disturbance signal; and code for causing a computer to subtract the synthesized disturbance signal from the output of the loop filter prior to the output of the loop filter being coupled to the oscillator.

Yet another aspect of the present disclosure provides a device for wireless communications, the device comprising a TX LO signal generator, a TX PLL coupled to the TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX PLL coupled to the RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX and RX PLL's comprising a loop filter and an oscillator having a controlled oscillation frequency, the output of the loop filter coupled to the oscillator to control the oscillation frequency, the at least one PLL further comprising a comparator and a feedback element, the feedback element coupling the output of the oscillator to the comparator, the output of the comparator coupled to the loop filter, the device comprising: a disturbance synthesis block and a subtraction element, the disturbance synthesis block configured to generate a synthesized disturbance signal, the subtraction element configured to subtract the synthesized disturbance signal from the output of the loop filter prior to being coupled to the oscillator.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

Figure 1:
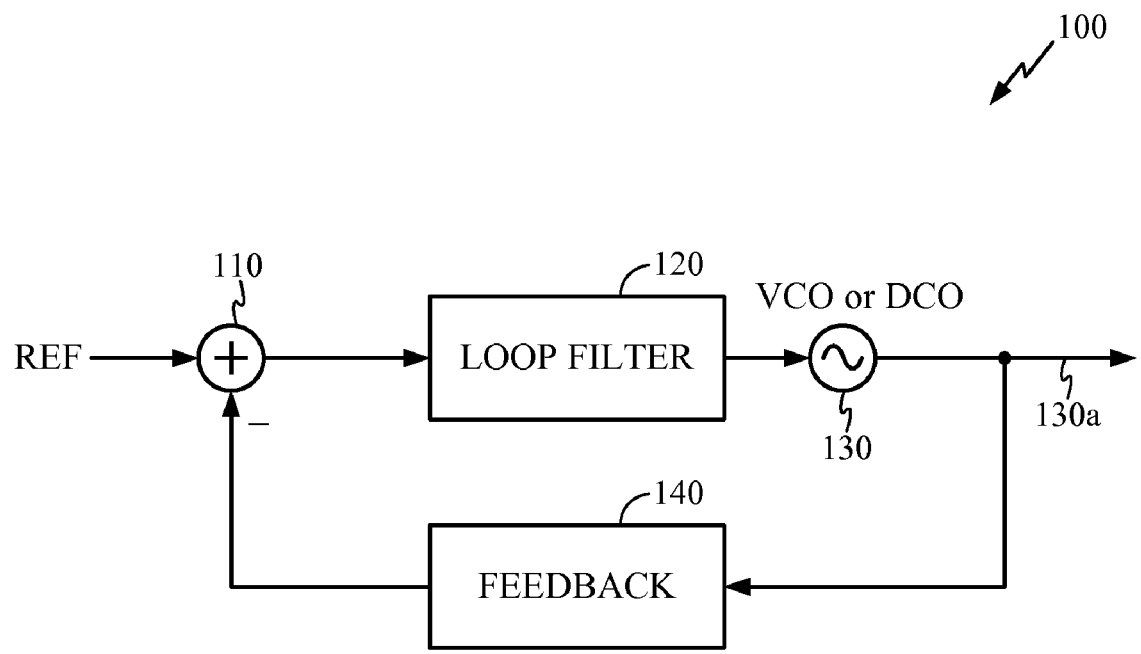
FIG. 1 illustrates a simplified block diagram of a prior art PLL.

FIG. 1 illustrates a simplified block diagram of a prior art PLL 100. The PLL 100 includes a comparator 110, loop filter 120, voltage controlled oscillator (VCO) or digitally controlled oscillator (DCO) 130, and a feedback element 140. One of ordinary skill in the art will appreciate that the feedback element 140 may include, e.g., a frequency divider.

During operation, the VCO or DCO 130 generates an output signal 130a having controllable output frequency. In a VCO implementation, the VCO output frequency may be controlled by an analog fine tuning voltage that, e.g., adjusts the capacitance of a varactor element of the VCO. In a DCO implementation, the DCO output frequency may be controlled by a digital fine tuning signal that, e.g., adjusts the net capacitance of a switchable capacitor bank of the DCO. The output signal 130a of the VCO or DCO 130 is processed by the feedback element 140 (e.g., divided down in frequency) prior to being input to comparator 110. Comparator 110 may compare the phase and/or frequency of the output of the feedback element 140 to a reference signal REF having frequency $F_{ref}$. The output of the comparator 110 is coupled to the loop filter 120, whose output is in turn coupled to the VCO or DCO 130 to control the frequency of signal 130a as previously described.

Note the PLL 100 may generally include analog and/or digital implementations of the blocks shown. For example, in an analog PLL implementation, the comparator 110 and loop filter 120 may be analog components, and a VCO may be provided to generate the PLL output signal 130a. In an all-digital PLL (ADPLL) implementation, the comparator 110 may include a digital phase accumulator and a time-to-digital converter, the loop filter 120 may be a digital filter, and a DCO may be provided to generate the PLL output signal 130a.

Figure 1A:
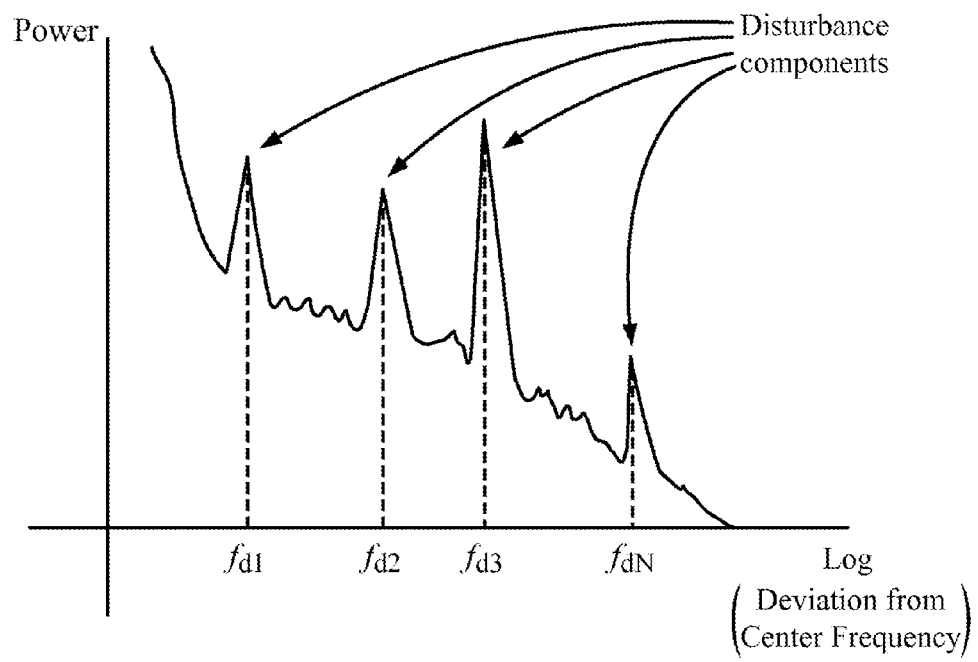
FIG. 1A shows a typical sample power spectral density (PSD) plot of the output signal derived from the PLL shown in FIG. 1.

FIG. 1A shows a typical sample power spectral density (PSD) plot of an output signal 130a derived from the PLL 100 shown in FIG. 1. Note a power level is shown on the vertical axis of the plot, while the deviation from the output center frequency is shown on the horizontal axis of the plot using a logarithmic scale. One of ordinary skill in the art will appreciate that the power spectral density profile of the output signal 130a is partly due to the dynamic closed-loop operation of the PLL 100, which continually adjusts the output signal 130a to reduce the error generated by the comparator 110. Also present in the power spectral density profile of the output signal 130a are illustrative disturbance components that appear at frequencies $f_{d1}$, $f_{d2}$, $f_{d3}$, and $f_{dN}$.

The source of such disturbance components may be external to the dynamic closed-loop operation of the PLL 100, and may be due to, e.g., periodic voltage fluctuations in the power supply, stray signals coupled into the VCO or DCO output via the device substrate, etc. They may also be internal to the operation of the PLL, e.g., integer/fractional type quantization in an ADPLL.

Note while each disturbance component shown in FIG. 1A is characterized by a distinct spectral frequency, the disturbance components contemplated to be within the scope of the present disclosure generally need not be restricted to those that can each be characterized by a single spectral frequency. For example, a disturbance component may include periodic pulses or other non-sinusoidal components characterized by a distinct Fourier spectrum that includes a plurality of spectral frequencies.

It would be desirable to provide techniques to reduce and/or even cancel the level of periodic disturbance components present in the output signal 130a.

Figure 2:
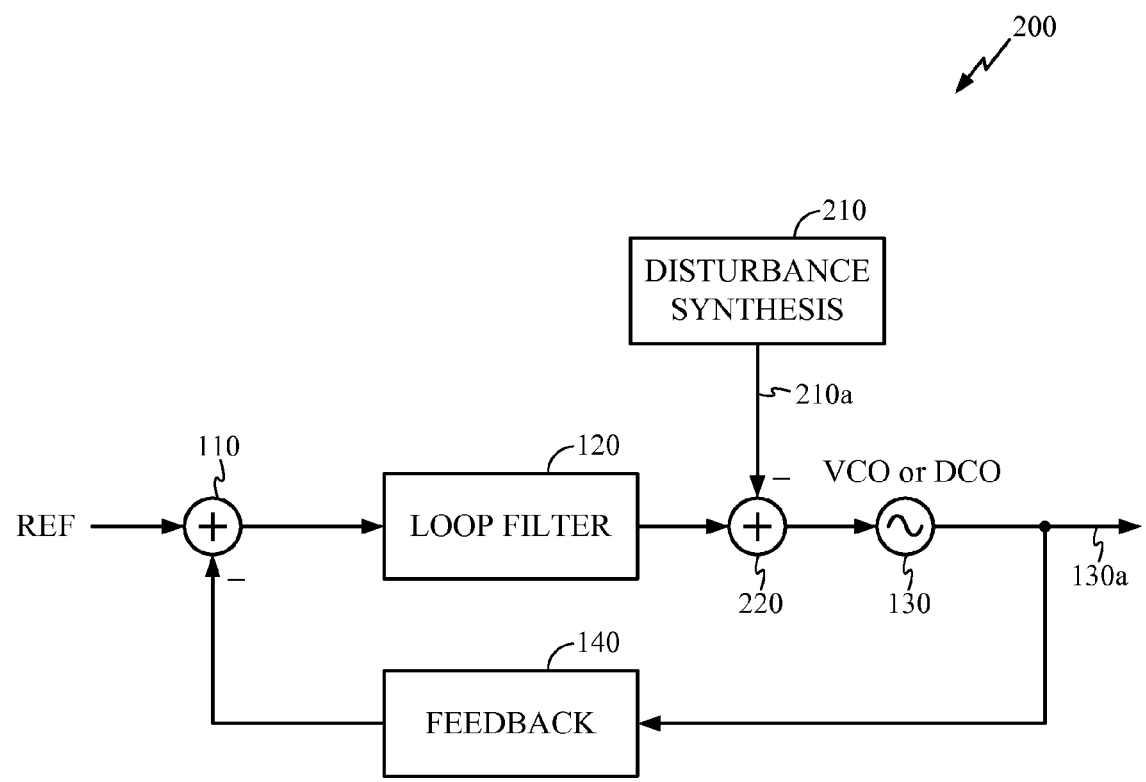
FIG. 2 illustrates an exemplary embodiment of a disturbance cancellation mechanism according to the present disclosure.

FIG. 2 illustrates an exemplary embodiment 200 of a disturbance cancellation mechanism according to the present disclosure. Note the exemplary embodiment 200 is shown for illustrative purposes only, and is not meant to limit the scope of the present disclosure.

In FIG. 2, a disturbance synthesis block 210 generates a synthesized disturbance signal 210a. A subtraction element 220 subtracts the synthesized disturbance signal 210a from the output of the loop filter 120, and the result is applied to VCO or DCO 130 to control the frequency of the signal 130a.

In an exemplary embodiment, the disturbance synthesis block 210 is configured to synthesize a replica of components present in the VCO or DCO input (or components that may be modeled as being present in the VCO or DCO input) giving rise to the one or more disturbance components in the output signal 130a. The disturbance synthesis block 210 may adjust the amplitude and phase of the synthesized disturbance signal 210a to match the corresponding amplitude and phase of the disturbance component. The subtraction of the synthesized disturbance signal 210a from the loop filter 120 output thus cancels the disturbance component in the output signal 130a.

Figure 3:
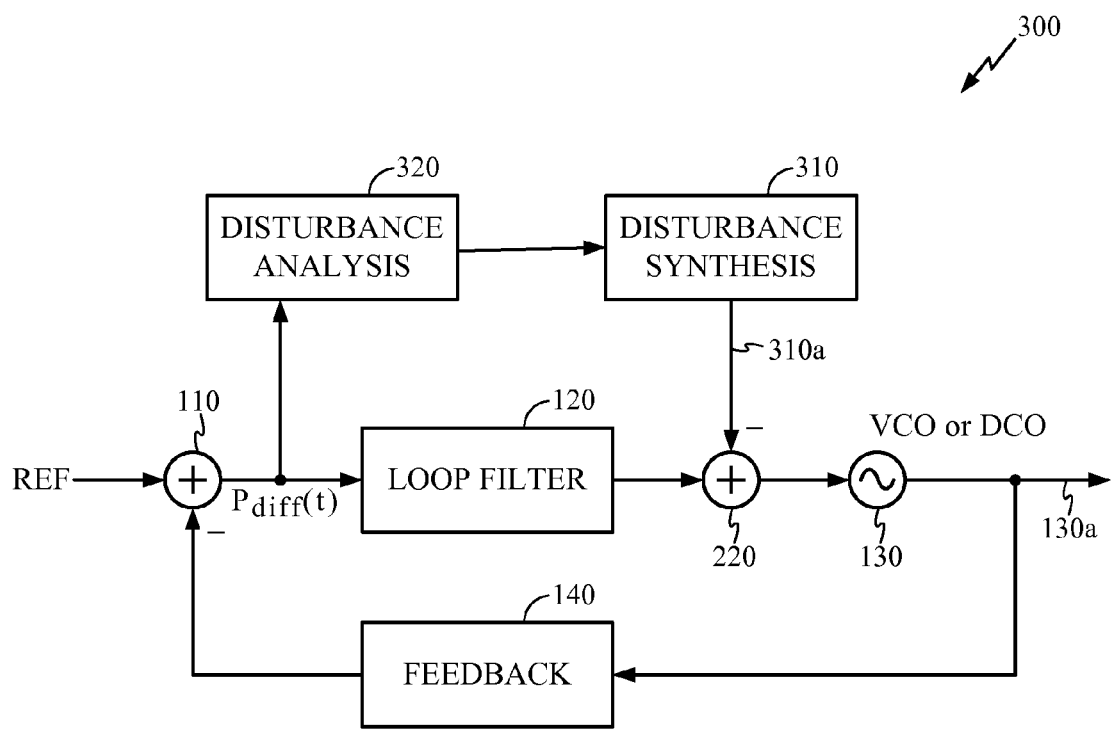
FIG. 3 illustrates an alternative exemplary embodiment of a disturbance cancellation mechanism according to the present disclosure.

FIG. 3 illustrates an alternative exemplary embodiment 300 of a disturbance cancellation mechanism according to the present disclosure. In FIG. 3, a disturbance synthesis block 310 is coupled with a disturbance analysis block 320. The disturbance synthesis block 320 generates a synthesized disturbance signal 310a based on the output of the disturbance analysis block 320. Disturbance analysis block 320 is configured to estimate the components in the VCO or DCO input giving rise to the disturbance signal in the output signal 130a.

In the exemplary embodiment shown, the disturbance analysis block 320 generates such estimates from the output $P_{diff}(t)$ of comparator 110. One of ordinary skill in the art will appreciate that in alternative exemplary embodiments (not shown), the disturbance analysis block 320 may generate such estimates from alternative signals in the PLL 300, e.g., from output signal 130a.

Note that FIG. 3 is not meant to restrict the scope of the present disclosure to disturbance cancellation schemes employing the disturbance analysis block 320. In alternative exemplary embodiments, such as shown in FIG. 2, a disturbance synthesis block 210 may be provided without the disturbance analysis block 320, and the parameters of the disturbance to be synthesized may be provided to the disturbance synthesis block 210 using means other than the disturbance analysis block 320. Such alternative exemplary embodiments are contemplated to be within the scope of the present disclosure.

Figure 4:
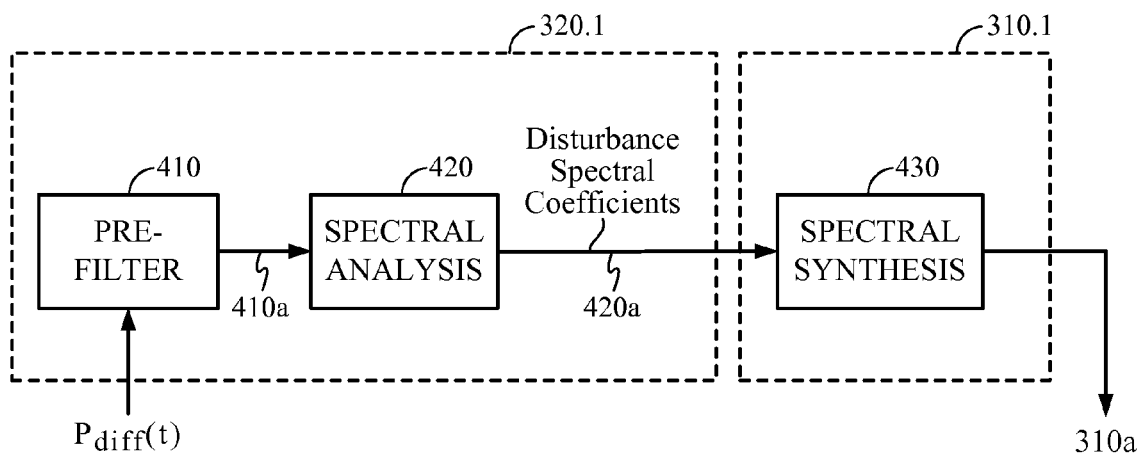
FIG. 4 illustrates exemplary embodiments of a disturbance synthesis block and disturbance analysis block according to the present disclosure.

FIG. 4 illustrates exemplary embodiments 310.1 and 320.1 of a disturbance synthesis block 310 and disturbance analysis block 320 according to the present disclosure.

In FIG. 4, disturbance analysis block 320.1 includes a pre-filter 410 and spectral analysis block 420. Pre-filter 410 filters the signal $P_{diff}(t)$ which, in an exemplary embodiment, corresponds to the output 110a of the comparator 110 as shown in FIG. 3. In an exemplary embodiment, the pre-filter 410 may be designed to have a frequency response that emphasizes spectral components of disturbance signals, while de-emphasizing spectral components of desired signals, i.e., signals arising from the desired dynamic closed-loop operation of the PLL. The output of the pre-filter 410 is designated as signal 410*a*.

Signal 410*a* is coupled to the spectral analysis block 420, which analyzes the spectral content of signal 410*a*. In an exemplary embodiment, the spectral analysis block 420 may measure the components in signal 410*a* at one or more predetermined disturbance signal frequencies. Such predetermined disturbance signal frequencies may correspond, e.g., to spur frequencies whose values are known a priori via computer simulations, lab testing, etc. The spectral analysis block 420 outputs spectral coefficients 420*a* that indicate a magnitude and phase for each of the one or more spectral components.

In FIG. 4, disturbance synthesis block 310.1 includes a spectral synthesis block 430. Spectral synthesis block 430 accepts the spectral coefficients 420*a* determined by the spectral analysis block 420, and reconstructs spectral components having magnitude and phase as specified by the spectral coefficients 420*a*. The output of the spectral synthesis block 430 may be provided as signal 310*a* to the subtraction element 220 in FIG. 3.

Figure 5:
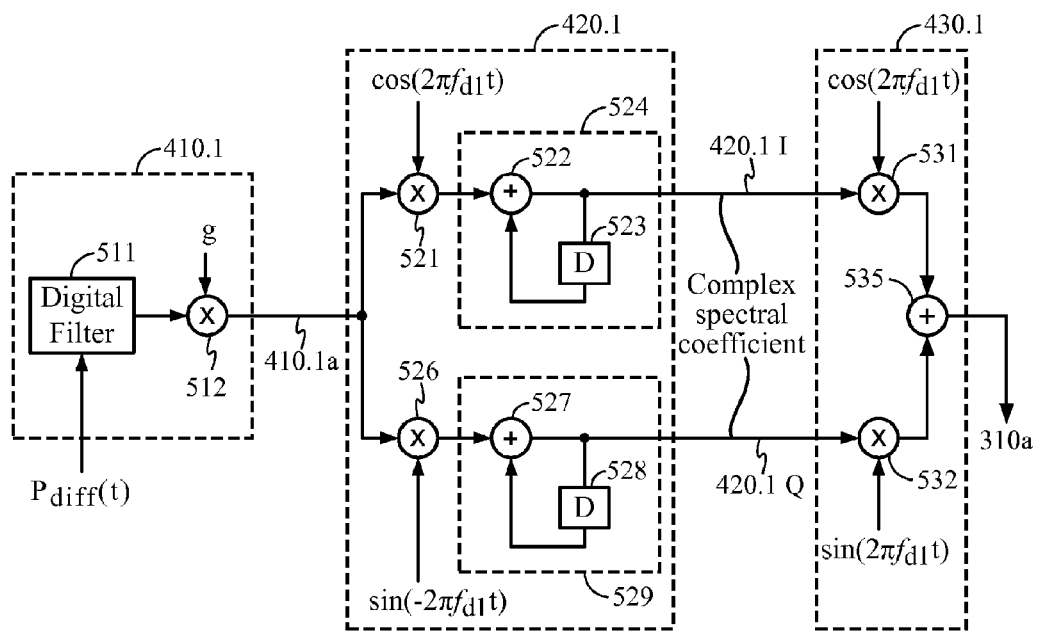
FIG. 5 illustrates exemplary embodiments of the pre-filter, spectral analysis block, and spectral synthesis block shown in FIG. 4.

FIG. 5 illustrates exemplary embodiments 410.1, 420.1, and 430.1 of the pre-filter 410, spectral analysis block 420, and spectral synthesis block 430 shown in FIG. 4.

Block 410.1 includes a digital filter 511 coupled with a gain element 512. The digital filter 511 filters the signal $P_{diff}(t)$ derived from the output of comparator 110. The digital filter 511 may be designed and implemented using techniques well-known in the art, e.g., by providing poles and/or zeroes to generate a frequency response having the desired characteristics for the pre-filter 410. The gain element 512 may be programmed to provide a net gain g to the digitally filtered signal for subsequent processing. The output signal of block 410.1 is designated as 410.1*a*, and coupled to block 420.1.

Note the exemplary embodiment 410.1 of pre-filter 410 shown depicts the signal $P_{diff}(t)$ derived from the output of comparator 110 as a digital signal. In alternative exemplary embodiments (not shown), e.g., wherein the output of comparator 110 is an analog signal, one of ordinary skill in the art will appreciate that appropriate techniques for analog-to-digital conversion may be applied prior to coupling the output of the comparator 110 to the digital filter 511 shown in FIG. 5. Alternatively, some of the processing shown may also be performed in the analog domain. Such alternative exemplary embodiments are contemplated to be within the scope of the present disclosure.

Block 420.1 determines the correlation of the signal 410.1*a* with a complex sinusoid having a frequency $f_{d1}$. In particular, block 420.1 includes an upper branch having elements 521, 522, 523, and a lower branch having elements 526, 527, 528. The mixers 521 and 526 multiply signal 410.1*a* with in-phase and quadrature sinusoids, respectively, each having a frequency $f_{d1}$, while adders 522, 527 and delay elements 523, 528 effectively perform a simple low-pass filtering (LPF) of the output signals of the mixers 521 and 526. The adder 522 and delay element 523 may be denoted as a first in-phase (I) LPF 524, while the adder 527 and delay element 528 may be denoted as a first quadrature (Q) LPF 529. The outputs 420.1I and 420.1Q of block 420.1 may represent the in-phase and quadrature components of a "complex spectral coefficient" associated with the disturbance frequency $f_{d1}$.

In an exemplary embodiment, the frequency $f_{d1}$ may be predetermined as a frequency associated with a known spur or other periodic disturbance signal.

Block 430.1 includes multipliers 531 and 532 that multiply the components 420.1I, 420.1Q of the complex spectral coefficient with in-phase and quadrature sinusoids, respectively, and an adder 535 for adding the resulting products to generate a reconstructed disturbance signal 310*a*.

Note the exemplary embodiment 430.1 of pre-filter 410 shown depicts reconstructed disturbance signal 310*a* as being a digital signal that may be directly coupled to the subtraction element 220 in FIG. 3. In alternative exemplary embodiments (not shown), e.g., wherein the input to a VCO 130 is an analog signal, one of ordinary skill in the art will appreciate that appropriate techniques for digital-to-analog conversion may be applied prior to subtracting the signal 310*a* from the input to a VCO 130. Such alternative exemplary embodiments are contemplated to be within the scope of the present disclosure.

Figure 6:
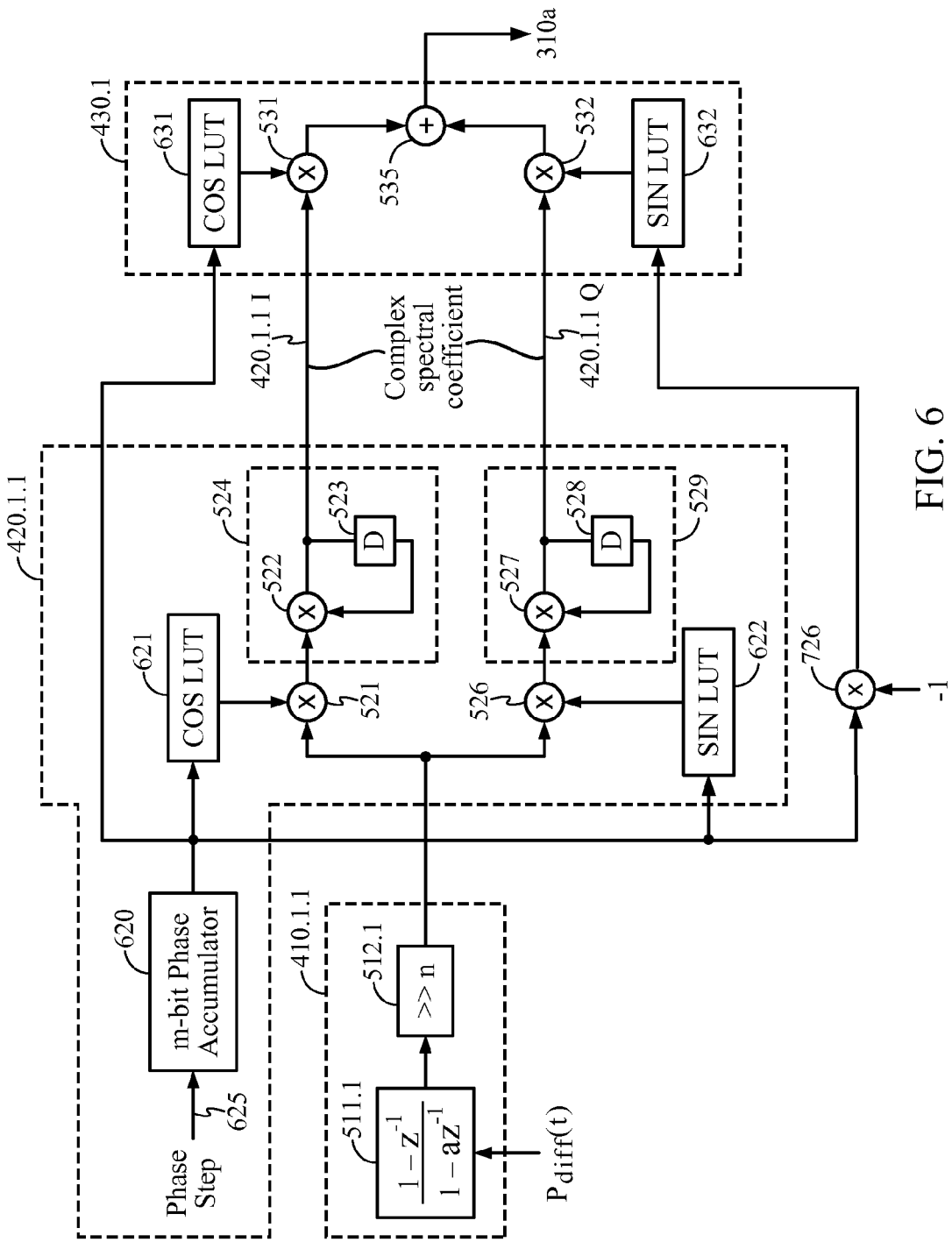
FIG. 6 illustrates exemplary embodiments of the blocks shown in FIG. 5.

FIG. 6 illustrates exemplary embodiments 410.1.1, 420.1.1, and 430.1.1 of the blocks 410.1, 420.1, and 430.1 shown in FIG. 5. Note the exemplary embodiments are shown for illustrative purposes only, and are not meant to limit the scope of the disclosure to any particular exemplary embodiments explicitly disclosed.

In FIG. 6, block 410.1.1 includes a digital filter 511.1 implemented as a simple one-zero one-pole digital filter well-known to one of ordinary skill in the art of digital filter design. To simplify the multiplication computation, the gain element 512.1 in block 410.1.1 is implemented as an n-bit right-shifting operation on a binary representation of the digital filter output.

In block 420.1.1, generation of the complex sinusoidal signal having frequency $f_{d1}$ is performed using an m-bit phase accumulator 620 coupled to cosine (COS) and sine (SIN) look-up tables (LUT's) 621 and 622. Phase accumulator 620 accumulates at regular intervals a phase argument for the COS and SIN LUT's 621 and 622, with the incremental phase accumulation value set by phase step 625. One of ordinary skill in the art will appreciate that the value selected for the phase step 625 effectively sets the frequency $f_{d1}$ of the complex sinusoid generated by the COS and SIN LUT's 621 and 622. For example, in an exemplary embodiment, the phase step may be set as follows:

$$\text{Phase step} = \text{round}\left(\frac{f_{d1}}{F_{ref}} 2^m\right); \qquad \text{(Equation 1)}$$

wherein the round( ) function rounds the quantity within parentheses to the nearest integer.

In the exemplary embodiment shown, the same technique is used to generate the complex sinusoids in the disturbance synthesis block 430.1.1, with the output of the phase accumulator 620 provided to COS and SIN LUT's 631 and 632. Note an inversion element 726 may be provided to ensure that the phase of the analysis function is the negative of the phase of the synthesis function, according to the principles of Fourier analysis known to one of ordinary skill in the art.

Figure 7:
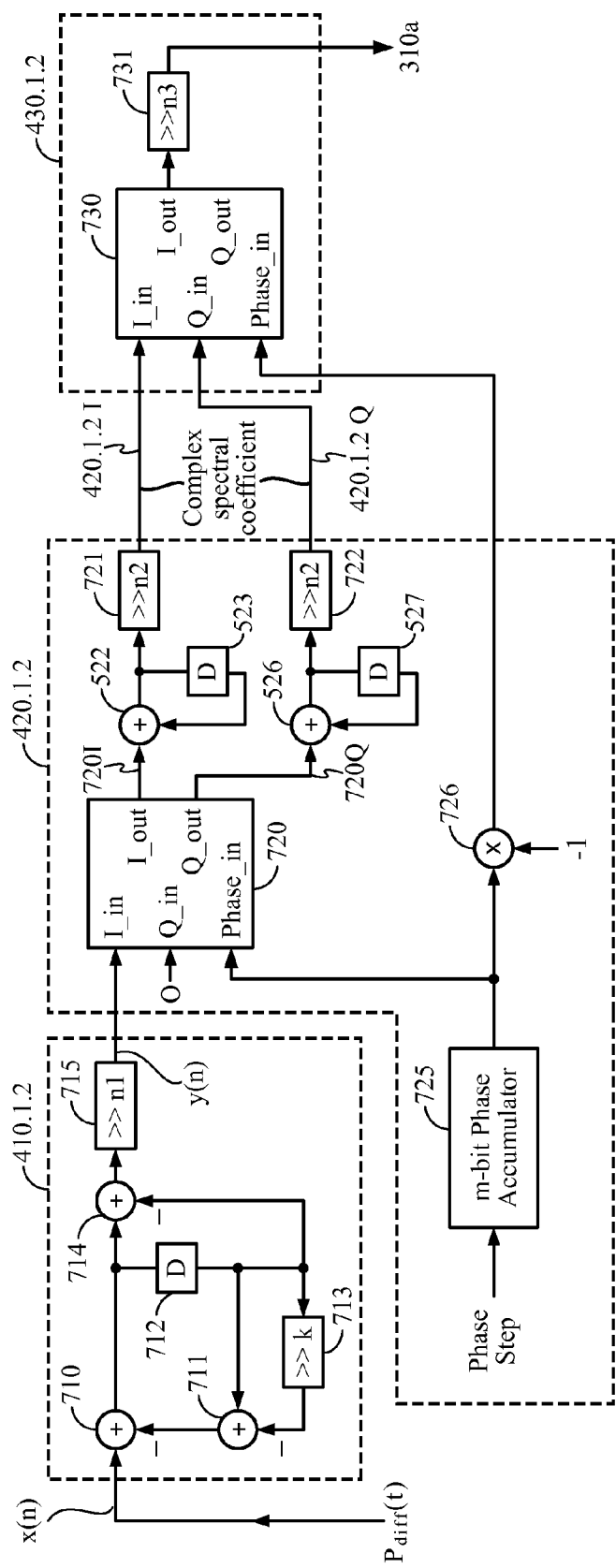
FIG. 7 illustrates alternative exemplary embodiments of the blocks shown in FIG. 5.

FIG. 7 illustrates alternative exemplary embodiments 410.1.2, 420.1.2, and 430.1.2 of the blocks 410.1, 420.1, and 430.1 shown in FIG. 5.

In FIG. 7, the pre-filter 410.1.2 includes adders 710, 711, 714, a delay element 712, and right bit-shifters 713, 715. One of ordinary skill in the art will appreciate that the elements of the pre-filter 410.1.2 collectively filter the signal x(n) to generate y(n), and implement a digital filter having the transfer function:

$$\frac{Y(z)}{X(z)} = \frac{b \cdot (1 - z^{-1})}{1 - az^{-1}};\quad \text{(Equation 2)}$$

wherein the coefficients a and b may be expressed as:

$$a = 1 - \frac{1}{2^k};\quad \text{(Equation 3)}$$

$$b = \frac{1}{2^{n1}}.\quad \text{(Equation 4)}$$

In an exemplary embodiment, the coefficient a is used to control the 3-dB bandwidth of the high-pass filter. The filter bandwidth may be set such that the target disturbance will be adequately suppressed, while not adversely affecting the performance of the estimator.

The spectral analysis block 420.1.2 includes a coordinate rotation digital computer (CORDIC) module 720, right bit-shifters 721, 722, and low-pass filters 524, 529. One of ordinary skill in the art will appreciate that the CORDIC module 720 effectively computes the product of y(n) with SIN and COS functions having argument determined by the output of the phase accumulator 725, without the need for a separate hardware multiplier. In an exemplary embodiment, the CORDIC module may be run for a minimum number of iterations, e.g., 8 iterations, to reach a desired level of accuracy for the computed output.

The outputs 720I and 720Q of the CORDIC module 720 are low-pass filtered by elements 522, 523, and 526, 527, respectively, before being applied with gains corresponding to $2^{-n2}$ by right bit-shifters 721, 722, respectively. The outputs of 721, 722 are provided as the complex spectral coefficient having in-phase and quadrature components 420.1.2I, 420.1.2Q, respectively.

The spectral synthesis block 430.1.2 includes a CORDIC module 730 and a right bit-shifter 731. The CORDIC module 730 effectively computes the product of the complex spectral coefficient 420.1.2I, 420.1.2Q with in-phase and quadrature sinusoids having phase derived from the phase accumulator 725, which is multiplied by an inverse phase component of −1 by multiplier 726. The in-phase output of CORDIC module 730 is applied with a gain corresponding to $2^{-n3}$ by right bit-shifter 731. The output of 731 is provided as signal 310a.

Figure 8:
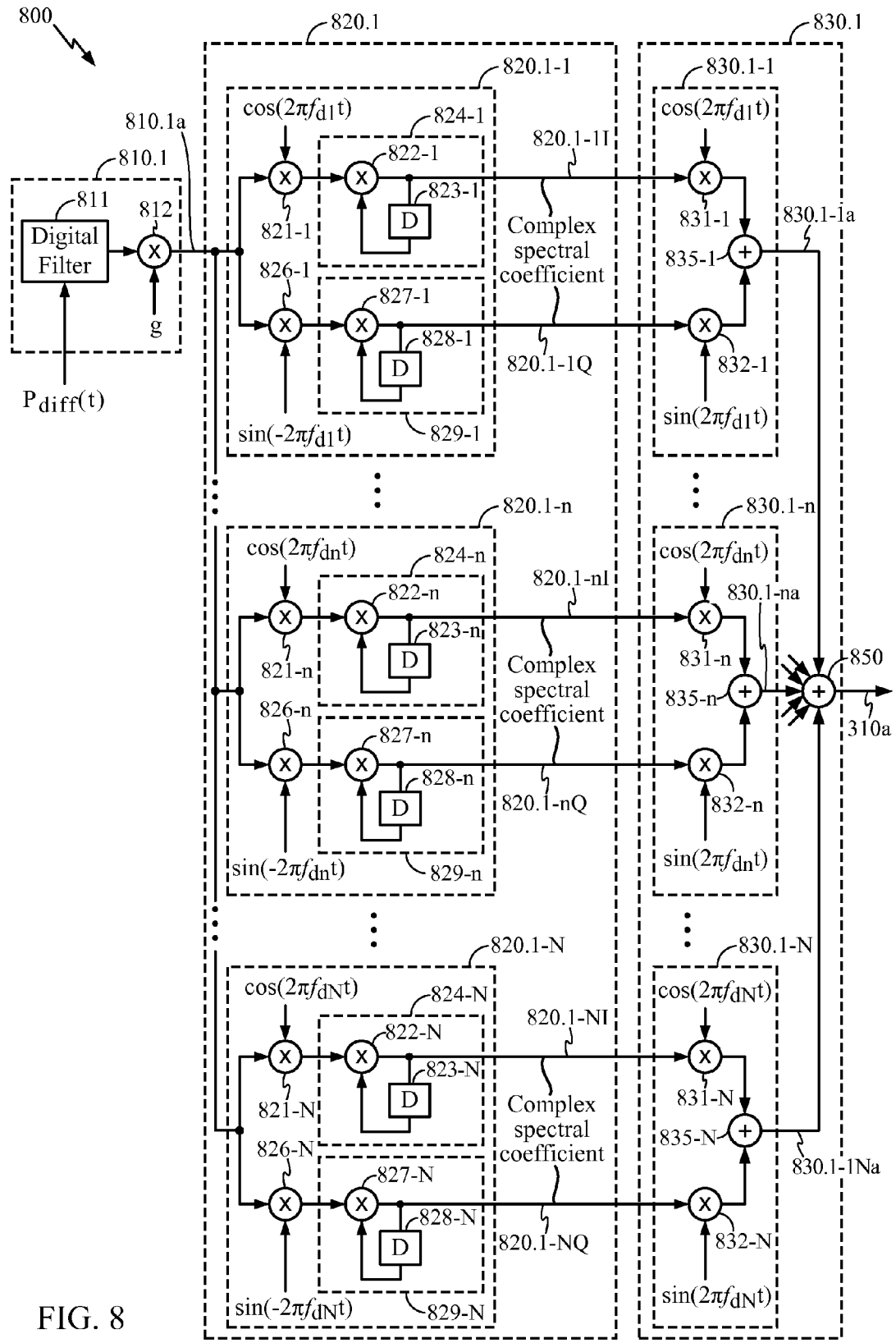
FIG. 8 illustrates an exemplary embodiment of the present disclosure for processing a plurality of spectral disturbance components.

FIG. 8 illustrates an exemplary embodiment 800 of the present disclosure for processing a plurality of spectral disturbance components. Such spectral disturbance components may correspond, e.g., to a plurality N of spur frequencies $f_{d1}$, ..., $f_{dn}$, ..., $f_{dN}$.

In FIG. 8, pre-filter 810.1 includes a digital filter 811 coupled with a gain element 812. The output signal of block 810.1 is designated as 810.1a.

Spectral analysis block 820.1 includes sub-blocks 820.1-1 through 820.1-N, each sub-block 820.1-n including an upper branch having elements 821-n, 822-n, 823-n, with 822-n and 823-n forming LPF 824-n, and a lower branch having elements 826-n, 827-n, 828-n, with 827-n and 828-n forming LPF 829-n. One of ordinary skill in the art will appreciate that each block 820.1-n determines the correlation of the signal 810.1a with a complex sinusoid having a frequency $f_{dn}$, and generates outputs 820.1-nI and 820.1-nQ that are collectively denoted as the "complex spectral coefficient" associated with the disturbance frequency $f_{dn}$.

In an exemplary embodiment, the frequencies $f_{d1}$ through $f_{dN}$ may be predetermined as frequencies associated with known spurs or other periodic disturbance signals.

Spectral synthesis block 830.1 includes sub-blocks 830.1-1 through 830.1-N, each sub-block 830.1-n including multipliers 831-n and 832-n for multiplying the complex spectral coefficient 820.1-nI, 820.1-nQ with in-phase and quadrature sinusoids having frequency $f_{dn}$, and an adder 835-n for adding the resulting products to generate a reconstructed spectral component 830.1-na. An adder 850 is further provided for adding all reconstructed spectral components 830.1-1a through 830.1-Na to generate the reconstructed disturbance signal 310a.

In an exemplary embodiment (not shown), e.g., wherein the frequency of a spur is not known a priori, it will be appreciated that a multi-component processing architecture such as shown in FIG. 8 may be utilized to evaluate the strengths of a plurality of candidate spur or other disturbance frequencies, and one or more frequencies having a highest measured metric (e.g., power or magnitude) may be chosen to be further reconstructed as signal 310a. One of ordinary skill in the art may readily derive techniques for ranking and/or choosing such candidates in light of the present disclosure.

One of ordinary skill in the art will appreciate that while the implementation of each sub-block 820.1-n and 830.1-n in the spectral analysis block 820.1 and the spectral synthesis block 830.1 has been explicitly shown in FIG. 8, alternative implementations of each sub-block may be readily derived in light of the present disclosure. For example, the techniques described with reference to FIGS. 6 and 7 may be readily adopted to alternatively implement the sub-blocks of the spectral analysis block 820.1 and spectral synthesis block 830.1. Such alternative exemplary embodiments are contemplated to be within the scope of the present disclosure.

Figure 9:
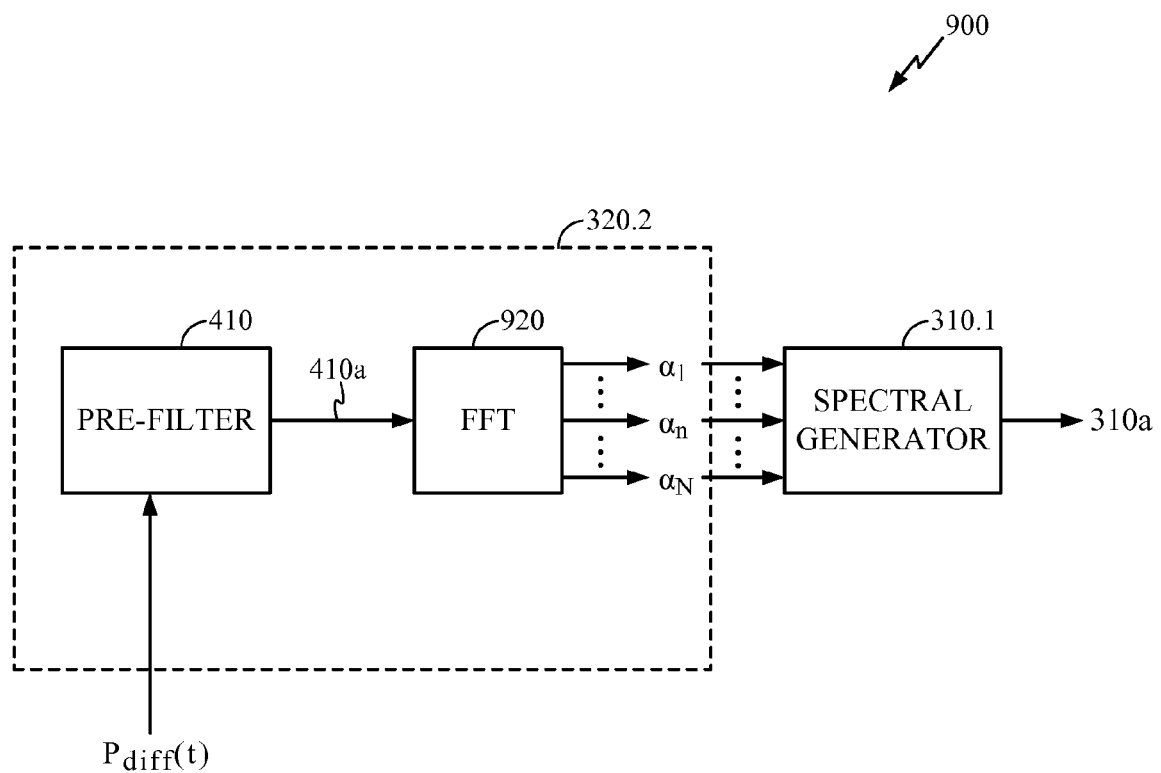
FIG. 9 illustrates alternative exemplary embodiments of a disturbance analysis block and a disturbance synthesis block according to the present disclosure.

FIG. 9 illustrates alternative exemplary embodiments 320.2 and 310.1 of disturbance analysis block 320 and disturbance synthesis block 310 according to the present disclosure.

In FIG. 9, disturbance analysis block 320 includes a pre-filter 410 for filtering the signal $P_{diff}(t)$. The output signal 410a of pre-filter 410 is coupled to the fast Fourier transform (FFT) block 920. The FFT block 920 may be configured to perform a fast Fourier transform on the signal 410a to generate a plurality of complex coefficients $\alpha 1$ through $\alpha N$, with each coefficient on representing the amplitude and phase of a sinusoidal component of the output signal 410a. The coefficients $\alpha 1$ through $\alpha N$ are supplied to the spectral generator 310.1, which weight each sinusoid n with the respective complex coefficient on to generate the reconstructed disturbance signal 310a.

In an exemplary embodiment, spectral generator 310.1 may include an inverse fast Fourier transform (IFFT) block (not shown), a look-up table (LUT) based generator, and/or a CORDIC-based generator.

In an exemplary embodiment (not shown), additional processing may be provided between the FFT block 920 and the spectral generator block 310.1. Such processing may include, e.g., identifying a spectral component having a maximum power from the results of the FFT block 920, and configuring the spectral generator 310.1 to generate only the spectral component having such maximum power. This and other alternative exemplary embodiments are contemplated to be within the scope of the present disclosure.

One of ordinary skill in the art will appreciate that while exemplary embodiments of a disturbance analysis block 320 have been shown in FIGS. 4 through 8 that are specifically configured to detect the presence of disturbance in a PLL signal using spectral analysis, alternative exemplary embodiments may be configured to detect the presence of disturbance using any other forms of functional analysis. For example, the disturbance analysis block 320 may be configured to correlate a signal with alternative disturbance signal templates, as further described hereinbelow.

Figure 10:
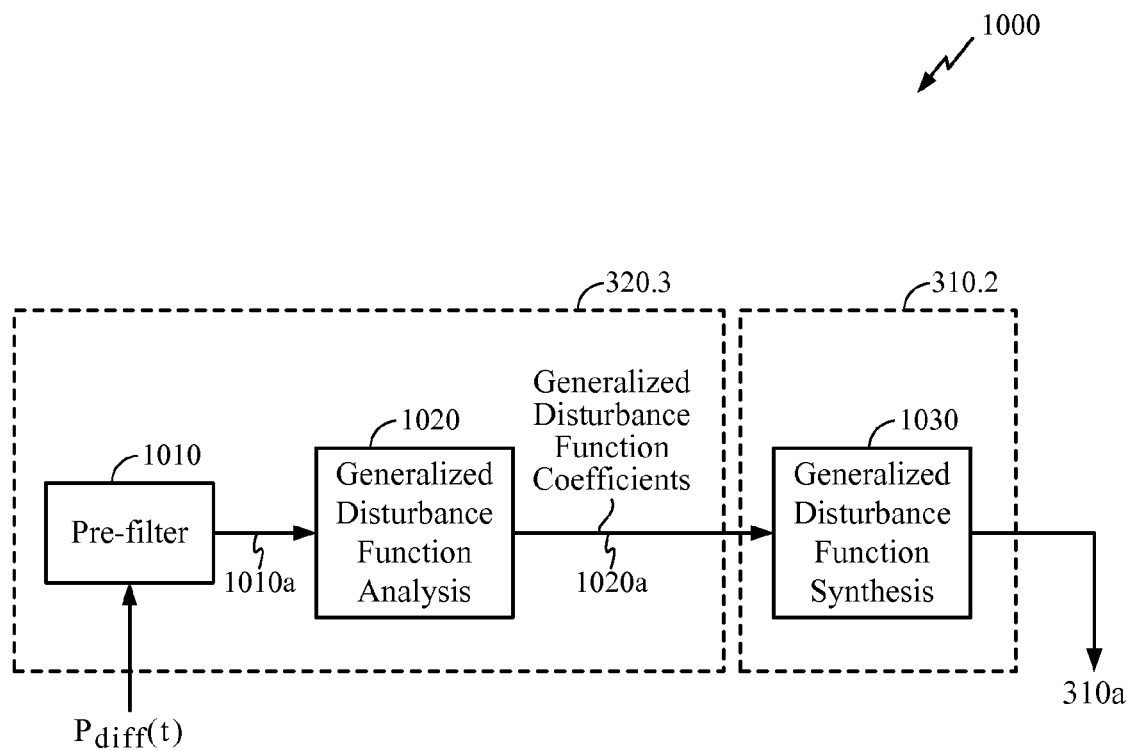
FIG. 10 illustrates alternative exemplary embodiments of a disturbance analysis block and disturbance synthesis block.

FIG. 10 illustrates alternative exemplary embodiments 320.3 and 310.2 of a disturbance analysis block 320 and disturbance synthesis block 310.

The disturbance analysis block 320.3 includes a pre-filter 1010 and a generalized disturbance function analysis block 1020. Block 1020 generates generalized disturbance function coefficients 1020a. In an exemplary embodiment, block 1020 may be configured to detect the presence of one or more generalized disturbance functions in the filtered signal 1010a. For example, in an exemplary embodiment, block 1020 may be configured to correlate the signal 1010a with one or more arbitrary pre-programmed periodic functions, and generate the one or more generalized disturbance function coefficients 1020a based on the results of such correlations. The arbitrary pre-programmed periodic function may include, e.g., a periodic pulse waveform, predetermined signal fluctuations corresponding to periodic supply voltage noise, etc. Such alternative functions are contemplated to be within the scope of the present disclosure.

The generalized disturbance function coefficients 1020a are coupled to a disturbance synthesis block 310.2 comprising a generalized disturbance synthesis block 1030. Block 1030 may weight a plurality of disturbance synthesis functions (not shown) using the generalized disturbance function coefficients 1020a, in a manner readily derivable by one of ordinary skill in the art in light of the present disclosure. The weighted functions may be combined and output as signal 310a.

Note in alternative exemplary embodiments (not shown), spectral analysis block 320 of FIG. 3 may readily be modified by one of ordinary skill in the art to accommodate intentional frequency modulation of the PLL output signal 130a. For example, in an exemplary embodiment wherein a frequency division ratio of the feedback element 140 is intentionally modulated, e.g., to achieve digital frequency modulation, the disturbance analysis block 320 may further incorporate a pre-processing block (not shown) to, e.g., subtract the expected disturbance in $P_{diff}$ (t) due to the digital frequency modulation. Such subtraction may input a copy of the known frequency modulation applied, and also account for the effects of the overall loop transfer function on the known frequency modulation applied. Such alternative exemplary embodiments are contemplated to be within the scope of the present disclosure.

Figure 11:
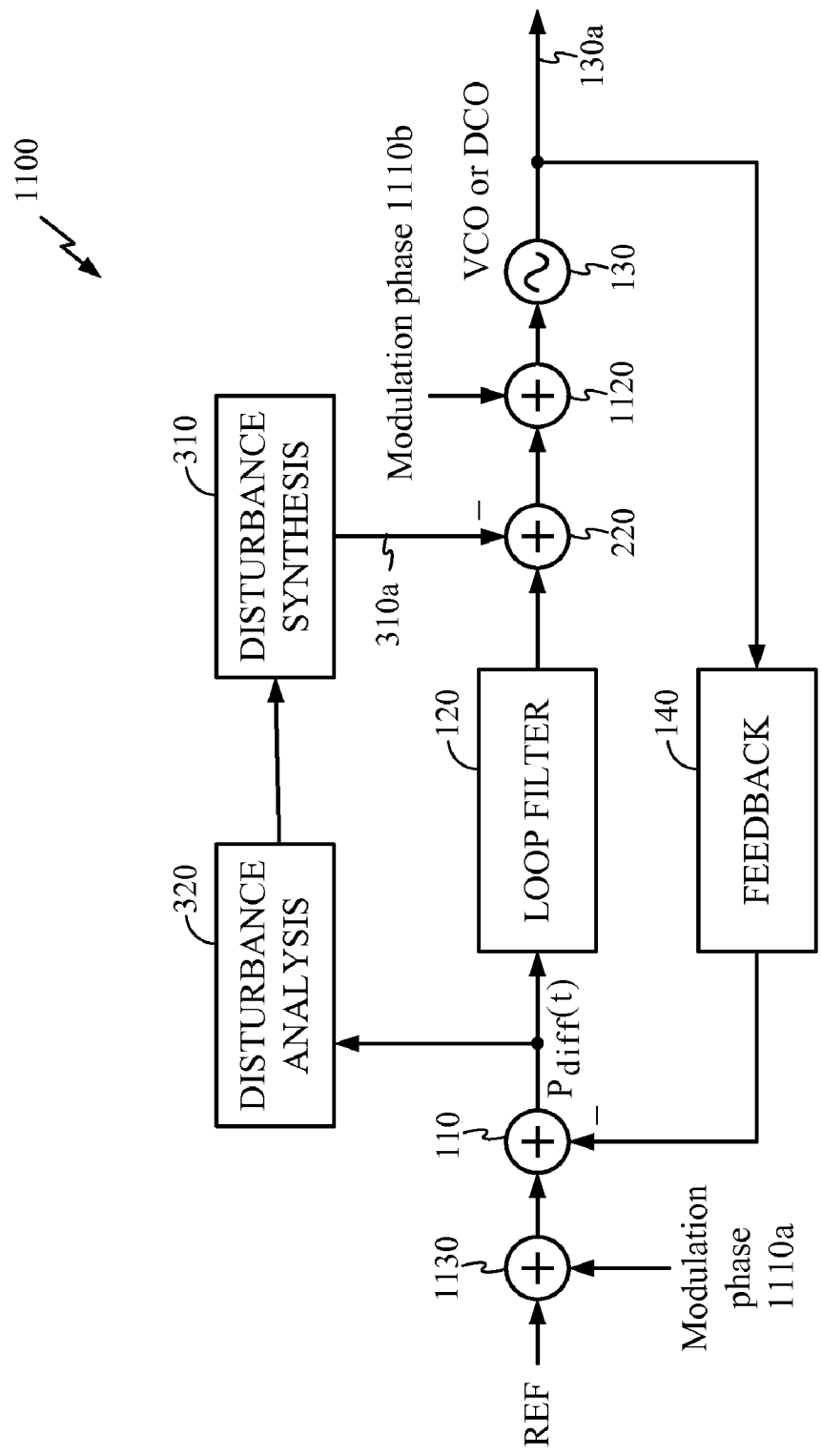
FIG. 11 illustrates an alternative exemplary embodiment of a PLL incorporating two-point modulation along with the disturbance analysis and synthesis techniques of the present disclosure.

FIG. 11 illustrates an alternative exemplary embodiment 1100 of a PLL incorporating modulation along with the disturbance analysis and synthesis techniques of the present disclosure. In FIG. 11, modulation phase 1110a and 1110b are injected into the loop using adders 1130 and 1120, in accordance with "two-point modulation" techniques well-known to one of ordinary skill in the art. One of ordinary skill in the art will appreciate that in this exemplary embodiment, the disturbance analysis block 320 need not be modified to accommodate the modulation phase 1110a and 1110b.

Figure 12A:
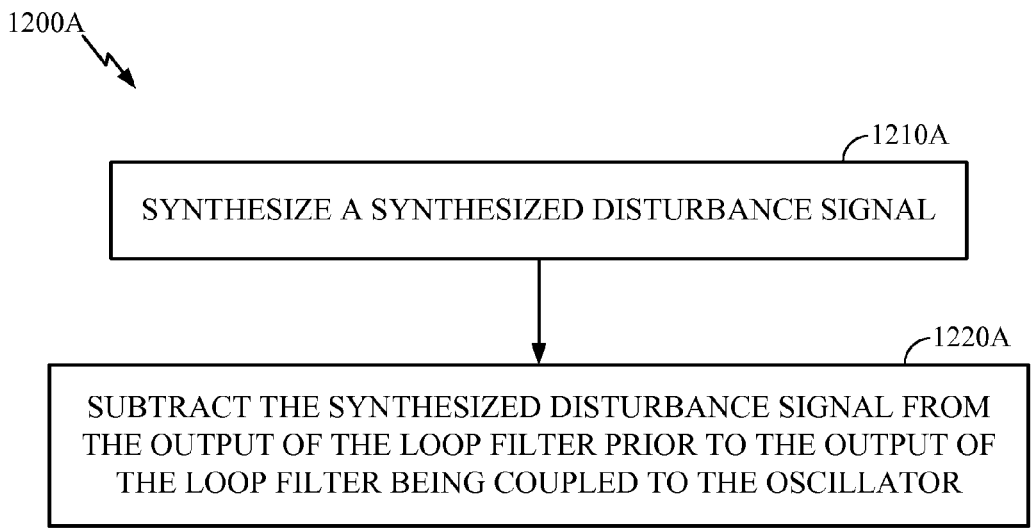
FIGS. 12A, 12B, and 12C illustrate exemplary embodiments of methods according to the present disclosure.
Figure 12B:
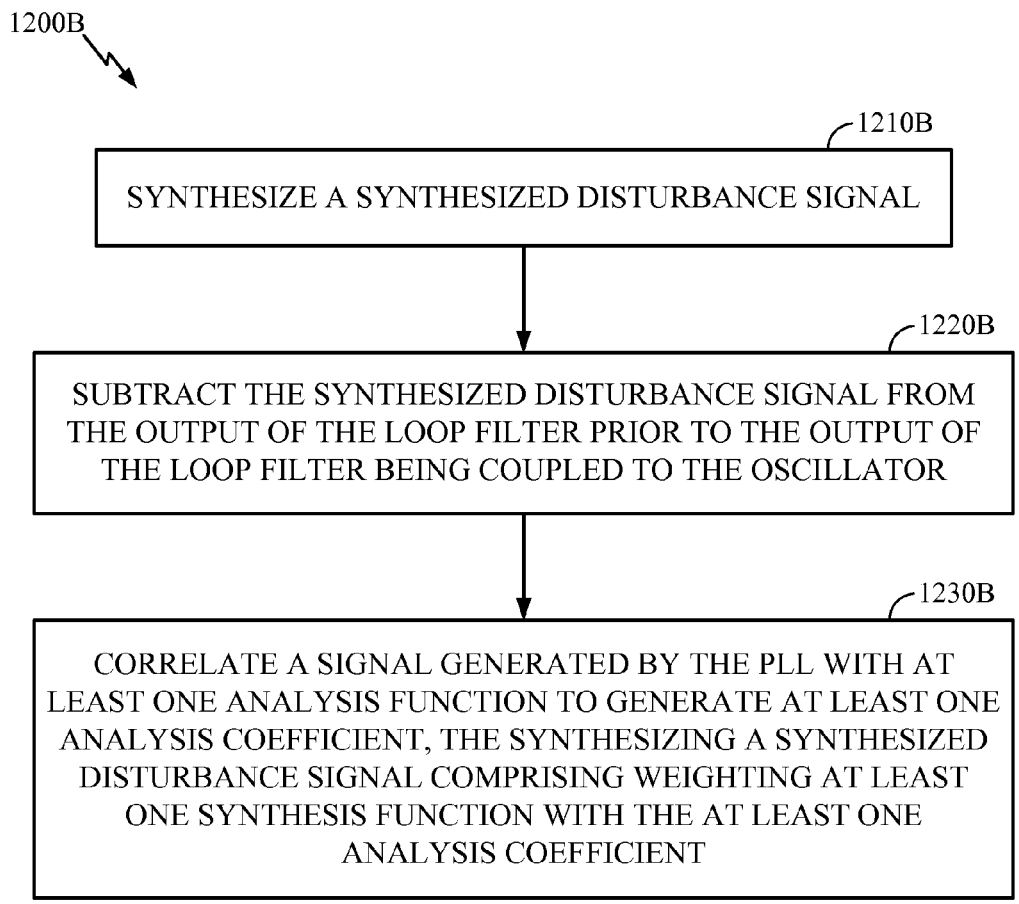
Figure 12C:
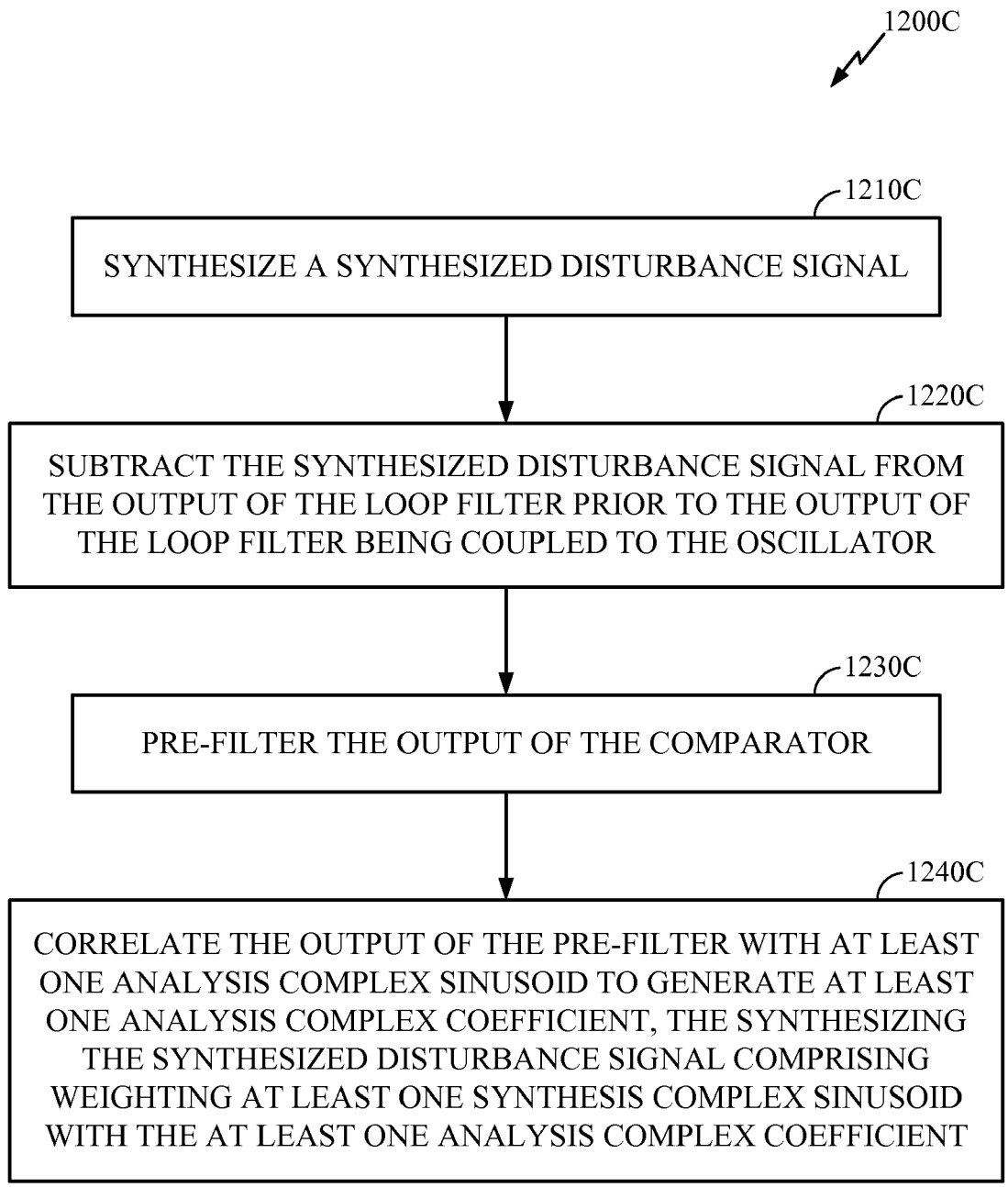

FIGS. 12A, 12B, and 12C illustrate exemplary embodiments of methods according to the present disclosure.

In FIG. 12A, a method 1200A for reducing a disturbance signal level in a phase-locked loop (PLL) is shown.

At block 1210A, the method includes synthesizing a synthesized disturbance signal.

At block 1220A, the method includes subtracting the synthesized disturbance signal from the output of the loop filter prior to the output of the loop filter being coupled to the oscillator.

In FIG. 12B, a method 1200B for reducing a disturbance signal level in a phase-locked loop (PLL) is shown.

At block 1210B, the method includes synthesizing a synthesized disturbance signal.

At block 1220B, the method includes subtracting the synthesized disturbance signal from the output of the loop filter prior to the output of the loop filter being coupled to the oscillator.

At block 1230B, the method includes correlating a signal generated by the PLL with at least one analysis function to generate at least one analysis coefficient, the synthesizing a synthesized disturbance signal comprising weighting at least one synthesis function with the at least one analysis coefficient.

In FIG. 12C, a method 1200C for reducing a disturbance signal level in a phase-locked loop (PLL) is shown.

At block 1210C, the method includes synthesizing a synthesized disturbance signal.

At block 1220C, the method includes subtracting the synthesized disturbance signal from the output of the loop filter prior to the output of the loop filter being coupled to the oscillator.

At block 1230C, the method includes pre-filtering the output of the comparator.

At block 1240C, the method includes correlating the output of the pre-filter with at least one analysis complex sinusoid to generate at least one analysis complex coefficient, the synthesizing the synthesized disturbance signal comprising weighting at least one synthesis complex sinusoid with the at least one analysis complex coefficient.

Figure 13:
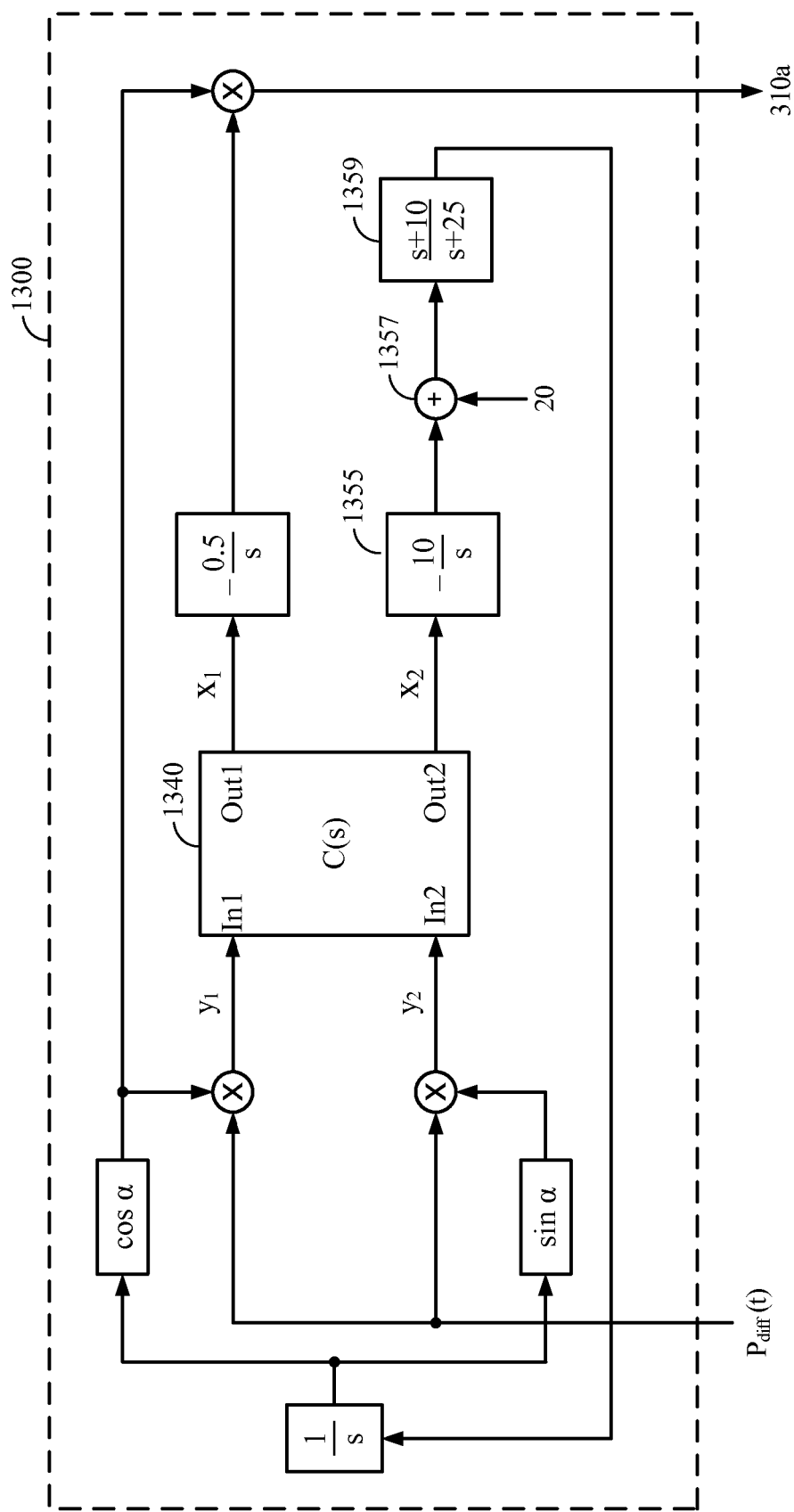
FIG. 13 illustrates an exemplary embodiment of a joint disturbance analysis and synthesis block according to the present disclosure.

FIG. 13 illustrates an exemplary embodiment 1300 of a joint disturbance analysis and synthesis block according to the present disclosure. The block 1300 accepts an input $P_{diff}$ (t) and outputs signal 310a. Block 1300 is configured to detect a disturbance with unknown frequency in $P_{diff}$ (t), and to generate a signal 310a to cancel such a disturbance. The operation and design of block 1300, and in particular, the user-defined transfer function C(s) or block 1340, to analyze and synthesize a disturbance with unknown frequency, will be clear to one of ordinary skill in the art in light of principles found in the prior art. See, e.g., Bodson, Marc and Scott C. Douglas, "Adaptive Algorithms for the Rejection of Sinusoidal Disturbances with Unknown Frequency," *Automatica*, Vol. 33, No. 12, pp. 2213-2221 (1997), the contents of which are hereby incorporated by reference in their entirety.

Figure 14:
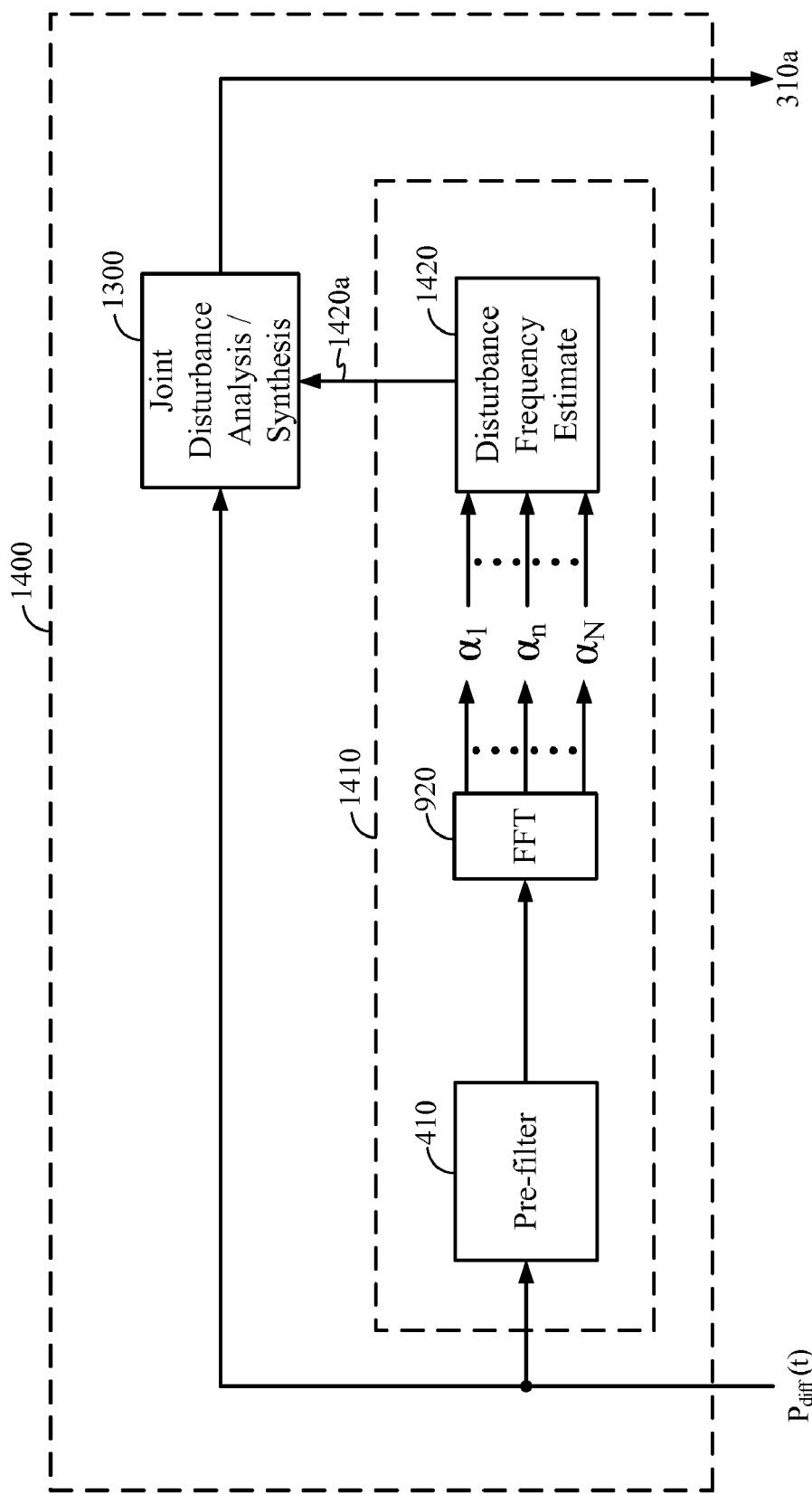
FIG. 14 illustrates an alternative exemplary embodiment of a joint disturbance analysis and synthesis block coupled with an initial frequency estimator.

FIG. 14 illustrates an alternative exemplary embodiment 1400 of a joint disturbance analysis and synthesis block 1300 coupled with an initial frequency estimator 1410. The initial frequency estimator 1410 includes a pre-filter 410 and FFT block 920, such as previously described with reference to FIG. 9. The outputs of FFT block 920, corresponding to estimated magnitude coefficients $\alpha_1$ through $\alpha_N$ of the spectral components analyzed by FFT block 920, are provided to a disturbance frequency estimate block 1420 to determine a frequency associated with the disturbance component. In an exemplary embodiment, the disturbance frequency estimate block 1420 may determine the frequency having the maximum magnitude coefficient $\alpha_{max}$ as determined by block 920. Such frequency may be output as an initial frequency estimate 1420a to the joint disturbance analysis and synthesis block 1300 earlier described with reference to FIG. 13. The provision of an initial frequency estimate 1420a may aid in the convergence of joint disturbance analysis and synthesis block 1300, in accordance with principles that will be clear to one of ordinary skill in the art.

Figure 15:
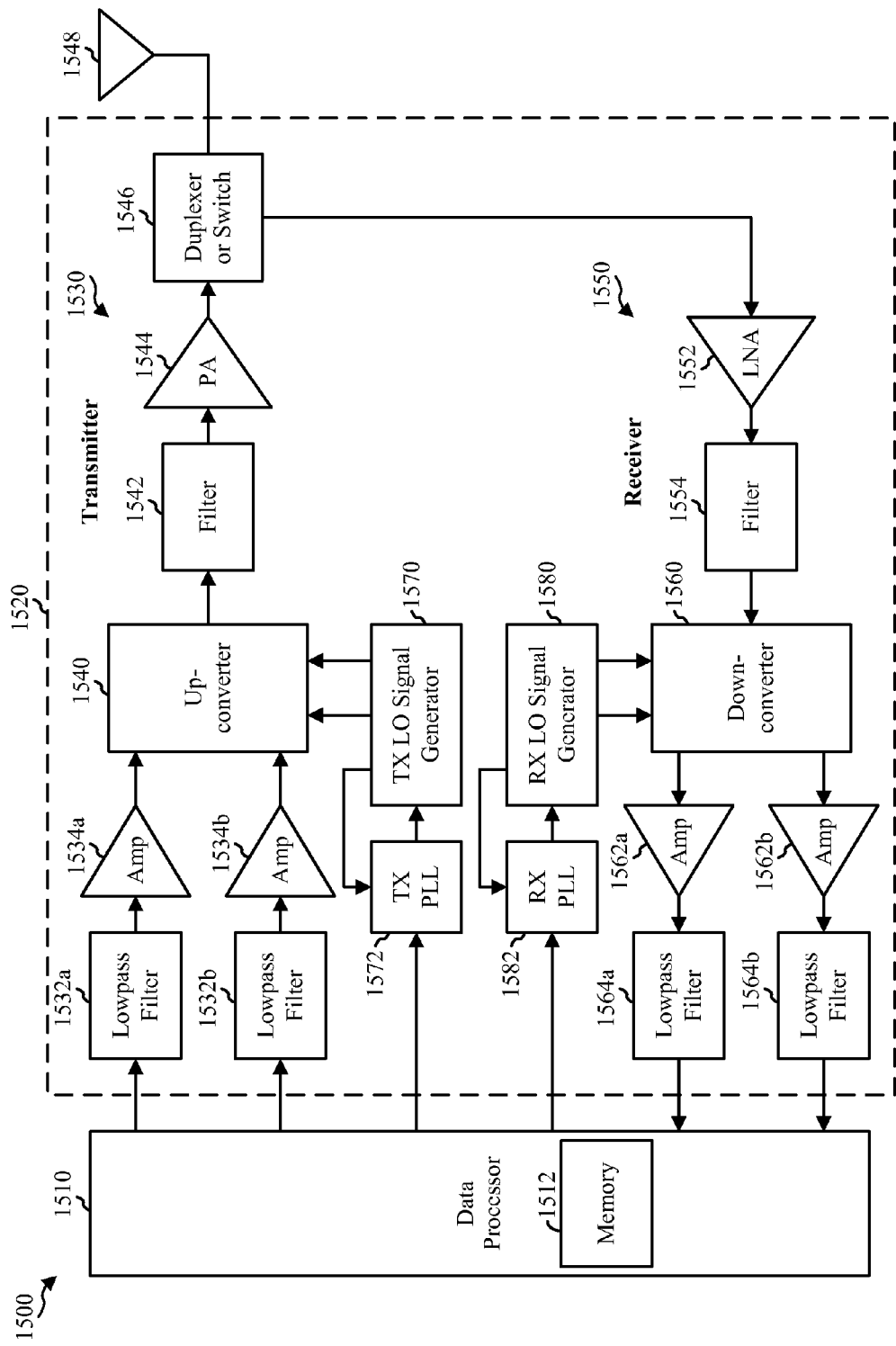
FIG. 15 illustrates a block diagram of a design of a wireless communication device in which the techniques of the present disclosure may be implemented.

FIG. 15 illustrates a block diagram of a design of a wireless communication device 1500 in which the techniques of the present disclosure may be implemented. In the design shown in FIG. 15, wireless device 1500 includes a transceiver 1520 and a data processor 1510 having a memory 1512 to store data and program codes. Transceiver 1520 includes a transmitter 1530 and a receiver 1550 that support bi-directional communication. In general, wireless device 1500 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 15, transmitter 1530 and receiver 1550 are implemented with the direct-conversion architecture.

In the transmit path, data processor 1510 processes data to be transmitted and provides I and Q analog output signals to transmitter 1530. Within transmitter 1530, lowpass filters 1532a and 1532b filter the I and Q analog output signals, respectively, to remove undesired images caused by the prior digital-to-analog conversion. Amplifiers (Amp) 1534a and 1534b amplify the signals from lowpass filters 1532a and 1532b, respectively, and provide I and Q baseband signals. An upconverter 1540 upconverts the I and Q baseband signals with I and Q transmit (TX) local oscillating (LO) signals from a TX LO signal generator 1570 and provides an upconverted signal. A filter 1542 filters the upconverted signal to remove undesired images caused by the frequency upconversion as well as noise in a receive frequency band. A power amplifier (PA) 1544 amplifies the signal from filter 1542 to obtain the desired output power level and provides a transmit RF signal. The transmit RF signal is routed through a duplexer or switch 1546 and transmitted via an antenna 1548.

In the receive path, antenna 1548 receives signals transmitted by base stations and provides a received RF signal, which is routed through duplexer or switch 1546 and provided to a low noise amplifier (LNA) 1552. The received RF signal is amplified by LNA 1552 and filtered by a filter 1554 to obtain a desirable RF input signal. A downconverter 1560 downconverts the RF input signal with I and Q receive (RX) LO signals from an RX LO signal generator 1580 and provides I and Q baseband signals. The I and Q baseband signals are amplified by amplifiers 1562a and 1562b and further filtered by lowpass filters 1564a and 1564b to obtain I and Q analog input signals, which are provided to data processor 1510.

TX LO signal generator 1570 generates the I and Q TX LO signals used for frequency upconversion. RX LO signal generator 1580 generates the I and Q RX LO signals used for frequency downconversion. Each LO signal is a periodic signal with a particular fundamental frequency. A PLL 1572 receives timing information from data processor 1510 and generates a control signal used to adjust the frequency and/or phase of the TX LO signals from LO signal generator 1570. Similarly, a PLL 1582 receives timing information from data processor 1510 and generates a control signal used to adjust the frequency and/or phase of the RX LO signals from LO signal generator 1580. One of ordinary skill in the art will appreciate that the techniques of the present disclosure may readily be applied to the design of, e.g., PLL's 1572 and 1582.

FIG. 15 shows an example transceiver design. In general, the conditioning of the signals in a transmitter and a receiver may be performed by one or more stages of amplifier, filter, upconverter, downconverter, etc. These circuit blocks may be arranged differently from the configuration shown in FIG. 15. Furthermore, other circuit blocks not shown in FIG. 15 may also be used to condition the signals in the transmitter and receiver. Some circuit blocks in FIG. 15 may also be omitted. All or a portion of transceiver 1520 may be implemented on one or more analog integrated circuits (ICs), RF ICs (RFICs), mixed-signal ICs, etc.

LO signal generators 1570 and 1580 may each include a frequency divider that receives a clock signal and provides a divider output signal. The clock signal may be generated by a voltage-controlled oscillator (VCO) or some other types of oscillator. The clock signal may also be referred to as a VCO signal, an oscillator signal, etc.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the exemplary embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the exemplary embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the exemplary embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosed exemplary embodiments is provided to enable any person skilled in the art to make or use the present invention. Various modifications to these exemplary embodiments will be readily apparent to those skilled in the art, and the generic principles defined herein may be applied to other exemplary embodiments without departing from the spirit or scope of the invention. Thus, the present invention is not intended to be limited to the exemplary embodiments shown herein but is to be accorded the widest scope consistent with the principles and novel features disclosed herein.

The invention claimed is:

1. An apparatus for reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, wherein the oscillator is a digitally controlled oscillator, and the output of the loop filter is a digital signal, the apparatus comprising:
a disturbance synthesis block and a subtraction element, the disturbance synthesis block configured to generate a synthesized disturbance signal, the subtraction element configured to subtract the synthesized disturbance signal from the output of the loop filter prior to being coupled to the oscillator.

2. The apparatus of claim 1, the synthesized disturbance signal being periodic over time.

3. An apparatus for reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising:
a disturbance synthesis block and a subtraction element, the disturbance synthesis block configured to generate a synthesized disturbance signal, the subtraction element configured to subtract the synthesized disturbance signal from the output of the loop filter prior to being coupled to the oscillator; and
a disturbance analysis block configured to correlate a signal generated by the PLL with at least one analysis function to generate at least one analysis coefficient, the disturbance synthesis block configured to weight at least one synthesis function with the at least one analysis coefficient to generate the synthesized disturbance signal.

4. The apparatus of claim 3, the disturbance analysis block configured to correlate the output of the comparator with the at least one analysis function.

5. The apparatus of claim 4, the disturbance analysis block comprising:
a pre-filter configured to filter the output of the comparator;
a generalized disturbance function analysis block configured to correlate the output of the pre-filter with the at least one analysis function.

6. The apparatus of claim 4, the feedback element configured to introduce modulation to the output of the oscillator, the disturbance analysis block further comprising a pre-processing block configured to subtract the expected disturbance in the output of the comparator due to the modulation.

7. The apparatus of claim 4, the output of the oscillator configured to be modulated using two-point modulation.

8. An apparatus for reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising:
a spectral synthesis block and a subtraction element, the spectral synthesis block generating a synthesized disturbance signal, the subtraction element configured to subtract the synthesized disturbance signal from the output of the loop filter prior to being coupled to the oscillator;
a pre-filter configured to filter the output of the comparator; and
a spectral analysis block configured to correlate the output of the pre-filter with at least one analysis complex sinusoid to generate at least one analysis complex coefficient, the spectral synthesis block configured to weight at least one synthesis complex sinusoid with the at least one analysis complex coefficient to generate the synthesized disturbance signal.

9. The apparatus of claim 8, the spectral analysis block comprising:
- a first I multiplier and a first I low-pass filter, the first I multiplier configured to multiply the output of the pre-filter with a first in-phase sinusoid having a first disturbance frequency, the first I low-pass filter configured to filter the output of the first I multiplier to generate an in-phase component of a first analysis complex coefficient;
- a first Q multiplier and a first Q low-pass filter, the first Q multiplier configured to multiply the output of the pre-filter with a first quadrature sinusoid having the first disturbance frequency, the first Q low-pass filter configured to filter the output of the first Q multiplier to generate a quadrature component of the first analysis complex coefficient;
- the spectral synthesis block comprising:
  - a first I synthesis multiplier configured to multiply a first synthesis in-phase sinusoid having the first disturbance frequency with the in-phase component of the first analysis complex coefficient;
  - a first Q synthesis multiplier configured to multiply a first synthesis quadrature sinusoid having the first disturbance frequency with the quadrature component of the first analysis complex coefficient; and
  - a first adder for adding the output of the first I synthesis multiplier to the output of the first Q synthesis multiplier to generate a first synthesized spectral component.

10. The apparatus of claim 9, further comprising:
a phase accumulator configured to accumulate a phase by a phase step, the output of the phase accumulator determining the phase of the first in-phase sinusoid, the first quadrature sinusoid, the first synthesis in-phase sinusoid, and the first synthesis quadrature sinusoid.

11. The apparatus of claim 10, further comprising:
- a cosine look-up table mapping the output of the phase accumulator to a value of the first in-phase sinusoid; and
- a sine look-up table mapping the output of the phase accumulator to a value of the first quadrature sinusoid.

12. The apparatus of claim 6, the pre-filter being a digital filter, the digital filter comprising a first zero and a first pole.

13. The apparatus of claim 8, the spectral analysis block comprising:
- a phase accumulator configured to accumulate a phase by a phase step;
- an analysis CORDIC module, an I input of the analysis CORDIC module coupled to the output of the pre-filter, a Q input of the analysis CORDIC module coupled to zero, a phase input of the analysis CORDIC module coupled to the output of the phase accumulator;
- a first I low-pass filter configured to filter an I output of the analysis CORDIC module to generate an in-phase component of a first analysis complex coefficient; and
- a first Q low-pass filter configured to filter a Q output of the analysis CORDIC module to generate a quadrature component of the first analysis complex coefficient.

14. The apparatus of claim 13, the spectral synthesis block comprising:
- a synthesis CORDIC module, an I input of the synthesis CORDIC module coupled to the in-phase component of the first analysis complex coefficient, a Q input of the synthesis CORDIC module coupled to the quadrature component of the first analysis complex coefficient, a phase input of the synthesis CORDIC module coupled to the output of the phase accumulator, an I output of the CORDIC module being coupled to the synthesized disturbance signal.

15. The apparatus of claim 9, the spectral analysis block further comprising:
- a second I multiplier and a second I low-pass filter, the second I multiplier configured to multiply the output of the pre-filter with a second in-phase sinusoid having a second disturbance frequency, the second I low-pass filter configured to filter the output of the second I multiplier to generate an in-phase component of a second analysis complex coefficient;
- a second Q multiplier and a second Q low-pass filter, the second Q multiplier configured to multiply the output of the pre-filter with a second quadrature sinusoid having the second disturbance frequency, the second I low-pass filter configured to filter the output of the second I multiplier to generate a quadrature component of the second analysis complex coefficient;
- the spectral synthesis block comprising:
  - a second I synthesis multiplier configured to multiply a second synthesis in-phase sinusoid having the second disturbance frequency with the in-phase component of the second analysis complex coefficient;
  - a second Q synthesis multiplier configured to multiply a second synthesis quadrature sinusoid having the second disturbance frequency with the quadrature component of the second analysis complex coefficient;
  - a second adder for adding the output of the second I synthesis multiplier to the output of the second Q synthesis multiplier to generate a second synthesized spectral component; and
  - a synthesis adder for adding the first and second synthesized spectral components to generate the synthesized disturbance signal.

16. The apparatus of claim 8, the spectral analysis block comprising a Fourier transform module, the Fourier transform module configured to generate a plurality of analysis complex coefficients from the output of the pre-filter based on performing the Fourier transform.

17. An apparatus for reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising:
- a disturbance subtraction element; and
- a joint disturbance analysis and synthesis block configured to generate a cancellation signal based on the output of the comparator, the subtraction element configured to subtract the cancellation signal from the output of the loop filter prior to being coupled to the oscillator.

18. The apparatus of claim 17, further comprising an initial frequency estimator coupled to the output of the comparator, the initial frequency estimator configured to estimate the frequency of a disturbance signal in the output of the comparator, the output of the initial frequency estimator coupled to the joint disturbance analysis and synthesis block.

19. A method for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the method comprising:

synthesizing a synthesized disturbance signal;

subtracting the synthesized disturbance signal from the output of the loop filter prior to the output of the loop filter being coupled to the oscillator;

correlating a signal generated by the PLL with at least one analysis function to generate at least one analysis coefficient, the synthesizing a synthesized disturbance signal comprising weighting at least one synthesis function with the at least one analysis coefficient.

20. A method for reducing a disturbance signal level in a phase-locked loop (PLL), the PLL comprising a loop filter, an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the method comprising:

synthesizing a synthesized disturbance signal;

subtracting the synthesized disturbance signal from the output of the loop filter prior to the output of the loop filter being coupled to the oscillator;

pre-filtering the output of the comparator; and correlating the output of the pre-filter with at least one analysis complex sinusoid to generate at least one analysis complex coefficient, the synthesizing the synthesized disturbance signal comprising weighting at least one synthesis complex sinusoid with the at least one analysis complex coefficient.

21. An apparatus for reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the apparatus comprising:

means for generating a synthesized disturbance signal;

means for subtracting the synthesized disturbance signal from the output of the loop filter prior to being coupled to the oscillator; and means for analyzing a signal generated by the PLL to aid the means for generating the synthesized disturbance signal.

22. A non-transitory computer-readable storage medium having stored thereon computer executable instructions configured to cause a computer to perform a method of reducing a disturbance signal level in a phase-locked loop (PLL), the PLL comprising a loop filter and an oscillator having a controlled oscillation frequency, the output of the loop filter coupled to the oscillator to control the oscillation frequency, the PLL further comprising a comparator and a feedback element, the feedback element coupling the output of the oscillator to the comparator, the output of the comparator coupled to the loop filter, the method comprising:

synthesizing a synthesized disturbance signal; and subtracting the synthesized disturbance signal from the output of the loop filter prior to the output of the loop filter being coupled to the oscillator.

23. The non-transitory computer-readable storage medium of claim 22 wherein the stored computer executable instructions are configured to cause a computer to perform a method, further comprising:

analyzing a signal generated by the PLL to aid in synthesizing the synthesized disturbance signal.

24. A device for wireless communications, the device comprising a TX LO signal generator, a TX PLL coupled to the TX LO signal generator, at least one baseband TX amplifier, an upconverter coupled to the TX LO signal generator and the at least one baseband TX amplifier, a TX filter coupled to the output of the upconverter, a power amplifier (PA) coupled to the TX filter, an RX LO signal generator, an RX PLL coupled to the RX LO signal generator, an RX filter, a downconverter coupled to the RX LO signal generator and the RX filter, a low-noise amplifier (LNA) coupled to the RX filter, and a duplexer coupled to the PA and the LNA, at least one of the TX and RX PLL's comprising a loop filter and an oscillator having a controlled oscillation frequency, the output of the loop filter coupled to the oscillator to control the oscillation frequency, the at least one PLL further comprising a comparator and a feedback element, the feedback element coupling the output of the oscillator to the comparator, the output of the comparator coupled to the loop filter, the device comprising:

a disturbance synthesis block and a subtraction element, the disturbance synthesis block configured to generate a synthesized disturbance signal, the subtraction element configured to subtract the synthesized disturbance signal from the output of the loop filter prior to being coupled to the oscillator; and a disturbance analysis block configured to correlate a signal generated by the PLL with at least one analysis function to generate at least one analysis coefficient, the disturbance synthesis block configured to weight at least one synthesis function with the at least one analysis coefficient to generate the synthesized disturbance signal.

* * * * *